US012785624B2

(12) United States Patent
Shang et al.

(10) Patent No.: US 12,785,624 B2
(45) Date of Patent: Nov. 3, 2026

(54) RADIO FREQUENCY LOW-NOISE AMPLIFIER CIRCUIT AND RADIO FREQUENCY CHIP

(71) Applicant: LANSUS TECHNOLOGIES INC., Shenzhen (CN)

(72) Inventors: Pengfei Shang, Shenzhen (CN); Jiashuai Guo, Shenzhen (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 313 days.

(21) Appl. No.: 18/806,717

(22) Filed: Aug. 16, 2024

(65) Prior Publication Data

US 2024/0413795 A1 Dec. 12, 2024

Related U.S. Application Data

(63) Continuation of application No. PCT/CN2023/114956, filed on Aug. 25, 2023.

(30) Foreign Application Priority Data

Oct. 9, 2022 (CN) ......................... 202211229565.8

(51) Int. Cl.
*H03F 1/02* (2006.01)
*H03F 1/26* (2006.01)
(Continued)

(52) U.S. Cl.
CPC ............. *H03F 1/0205* (2013.01); *H03F 1/26* (2013.01); *H03F 3/195* (2013.01); *H04B 1/0475* (2013.01);
(Continued)

(58) Field of Classification Search
CPC .......... H03F 1/0205; H03F 1/26; H03F 3/195; H03F 2200/294; H03F 2200/451;
(Continued)

(56) References Cited

U.S. PATENT DOCUMENTS

| | | | | |
|---|---|---|---|---|
| 12,113,495 B2 * | 10/2024 | Chen | ....................... | H03F 1/223 |
| 2008/0204142 A1 | 8/2008 | Kang | | |

(Continued)

FOREIGN PATENT DOCUMENTS

| | | |
|---|---|---|
| CN | 2001085973 A | 3/2001 |
| CN | 101252341 A | 8/2008 |

(Continued)

OTHER PUBLICATIONS

Notification to Grant Patent Right for Invention, Chinese Application No. 202211229565.8, mailed Dec. 5, 2022 (3 pages).

(Continued)

*Primary Examiner* — Khanh V Nguyen

(57) ABSTRACT

A radio frequency low-noise amplifier circuit and a radio frequency chip includes a signal input end, an input matching circuit, an amplification circuit, an output matching circuit, a signal output end, and a gain adjustment circuit connected in parallel with the amplification circuit. The gain adjustment circuit includes a tenth transistor, an eleventh transistor, a twelfth transistor, a first resistor, a second resistor, a third resistor, and a fourth capacitor. A source of the tenth transistor, a source of the eleventh transistor, and a source of the twelfth transistor are connected and are grounded. The tenth transistor is connected to the first resistor, the eleventh transistor is connected to the second resistor, and the twelfth transistor is connected to the third resistor. The first resistor, the second resistor, and the third resistor are connected to the fourth capacitor. The fourth capacitor is connected to the amplification circuit.

7 Claims, 2 Drawing Sheets

(51) Int. Cl.
*H03F 3/195* (2006.01)
*H04B 1/04* (2006.01)

(52) U.S. Cl.
CPC ..... *H04B 1/0483* (2013.01); *H03F 2200/294* (2013.01); *H03F 2200/451* (2013.01); *H04B 2001/0408* (2013.01)

(58) Field of Classification Search
CPC .... H03F 1/223; H03F 1/565; H03F 2200/222; H03F 2200/387; H03F 2200/399; H03F 2200/42; H03F 2200/48; H03F 2200/489; H03F 2200/492; H03F 3/191; H03F 1/56; H04B 1/0475; H04B 1/0483; H04B 2001/0408; H03G 1/0088; H03G 3/3036; H03G 3/3042; H03G 1/0023; H03G 3/001; Y02D 30/70
See application file for complete search history.

(56) References Cited

U.S. PATENT DOCUMENTS

| | | | |
|---|---|---|---|
| 2012/0032743 | A1 | 2/2012 | Hsieh et al. |
| 2012/0161875 | A1 | 6/2012 | Trulls Fortuny et al. |
| 2018/0083579 | A1* | 3/2018 | Noori .................. H03G 1/0029 |
| 2018/0175807 | A1 | 6/2018 | Cheng |
| 2020/0382080 | A1 | 12/2020 | Seshita |

FOREIGN PATENT DOCUMENTS

| | | | |
|---|---|---|---|
| CN | 105978512 | A | 9/2016 |
| CN | 107404289 | A | 11/2017 |
| CN | 113644882 | A | 11/2021 |
| CN | 114793094 | A | 7/2022 |
| CN | 115333493 | A | 11/2022 |
| JP | 2016508702 | A | 3/2016 |
| JP | 2022101825 | A | 7/2022 |
| KR | 100829780 | B1 | 5/2008 |

OTHER PUBLICATIONS

CNIPA, Office Action issued for Chinese Application No. 202211229565.8, mailed Nov. 18, 2022 (16 pages).

Kaija T et al: "Novel Study of Influence of Gate Layout Geometries on RF Cascode nMOSFET Transit Frequency", Physica Scripta T—Proceedings of the 20th Nordic Semiconductor Meeting (NSM20) 2004, Aug. 25, 2003, pp. 213-216, XP093281849, DOI: 10.1088/0031-8949/2004/T114/054.

Mingyuan Li et al: "A single-chip 2.4GHz double cascode power amplifier with switched programmable feedback biasing under multiple supply voltages in 65nm CMOS for WLAN application", Radio Frequency Integrated Circuits Symposium (RFIC), 2010 IEEE, IEEE, Piscataway, NJ, USA, May 23, 2010, pp. 391-394, XP031684144, ISBN: 978-1-4244-6240-7.

* cited by examiner

RADIO FREQUENCY LOW-NOISE AMPLIFIER CIRCUIT AND RADIO FREQUENCY CHIP

TECHNICAL FIELD

The present disclosure relates to a technical field of wireless communications, and in particular to a radio frequency low-noise amplifier circuit and a radio frequency chip.

BACKGROUND

As humans enter the information age, wireless communication technology develops rapidly. Mobile phones, wireless local area network (WLANs), BLUETOOTH, etc., become an indispensable part of social life and development. Advancement of the wireless communication technology is inseparable from the development of radio frequency circuits and microwave technology. At present, in wireless transceiver systems, radio frequency amplifiers are one of important components.

A conventional radio frequency low-noise amplifier has a fixed gain, and a gain of a radio frequency receiving link is adjusted by a subsequent variable gain amplifier to adapt to input signals of different power sizes. A fifth generation mobile communication technology (5G) radio frequency system platform requires that a low-noise amplifier located at a front end thereof has adjustable gain to realize a wide input dynamic range, while reducing complexity of the subsequent intermediate frequency amplifier circuit.

However, a conventional radio frequency low-noise amplifier circuit in the prior art has poor gain adjustment effect, low adaptation rate, and small adaptation range.

SUMMARY

In view of above deficiencies of the prior art, the present disclosure provides a radio frequency low-noise amplifier circuit and a radio frequency chip that have a flexible gain, a small return loss, and high safety to solve above technical problems.

In order to solve the above technical problems, the present disclosure adopts following technical solutions.

In a first aspect, the present disclosure provides a radio frequency low-noise amplifier circuit. The radio frequency low-noise amplifier circuit comprises a signal input end, an input matching circuit, an amplification circuit, an output matching circuit, a signal output end, and a gain adjustment circuit connected in parallel with the amplification circuit.

The signal input end, the input matching circuit, the amplification circuit, the output matching circuit, and the signal output end are connected in sequence. The gain adjustment circuit comprises a tenth transistor, an eleventh transistor, a twelfth transistor, a first resistor, a second resistor, a third resistor, and a fourth capacitor.

A source of the tenth transistor, a source of the eleventh transistor, and a source of the twelfth transistor are connected to each other and are grounded. A drain of the tenth transistor is connected to a first end of the first resistor, a drain of the eleventh transistor is connected to a first end of the second resistor, and a drain of the twelfth transistor is connected to a first end of the third resistor.

A second end of the first resistor, a second end of the second resistor, and a second end of the third resistor are connected to a first end of the fourth capacitor. A second end of the fourth capacitor is configured as an input end of the gain adjustment circuit and is connected to the amplification circuit.

Optionally, the amplification circuit comprises a first transistor, a second transistor, a third transistor, a fourth transistor, a fifth transistor, and a sixth transistor.

A source of the first transistor, a source of the second transistor and a source of the third transistor are connected to each other to form a common input structure. The common input structure is connected to the input matching circuit. A drain of the first transistor is connected to a source of the fourth transistor, a drain of the second transistor is connected to a source of the fifth transistor, and a drain of the third transistor is connected to a source of the sixth transistor. A gate of the first transistor, a gate of the second transistor, and a gate of the third transistor are connected to each other and are connected to the input matching circuit.

A drain of the fourth transistor, a drain of the fifth transistor, and a drain of the sixth transistor are connected to each other and are connected to an input end of the output matching circuit and an input end of the gain adjustment circuit.

Optionally, the amplification circuit further comprises a seventh transistor. A source of the seventh transistor is connected to the drain of the fourth transistor, and a drain of the seventh transistor is connected to the input end of the output matching circuit.

Optionally, the output matching circuit comprises a first inductor, a first capacitor, and a second capacitor. A first end of the first inductor is connected to a power supply voltage, and a second end of the first inductor is configured as the input end of the output matching circuit and is connected to the drain of the seventh transistor. The first capacitor is connected in parallel with the first inductor. A first end of the second capacitor is connected to the second end of the first inductor, and a second end of the second capacitor is connected to the signal output end.

Optionally, the input matching circuit comprises a first input matching network and a second input matching network. An input end of the first input matching network is connected to the signal input end. An output end of the first input matching network is connected to the gate of the first transistor, an output end of the second input matching network is grounded, and an input end of the second input matching network is connected to a source of the first transistor.

Optionally, the first input matching network comprises a second inductor and a third capacitor. A first end of the second inductor is configured as the input end of the first input matching network and is connected to the signal input end. A second end of the second inductor is connected to a first end of the third capacitor, and a second end of the third capacitor is connected to the gate of the first transistor.

Optionally, the second input matching network comprises an eighth transistor, a ninth transistor, a third inductor, and a fourth inductor. A source of the eighth transistor and a source of the ninth transistor are connected to each other and are grounded. A drain of the ninth transistor is connected to a first end of the third inductor, and a drain of the eighth transistor is connected to a second end of the third inductor. A first end of the fourth inductor is connected to the second end of the third inductor, and a second end of the fourth inductor is connected to the source of the second transistor.

Optionally, the third inductor and the fourth inductor are connected in series to form a source inductor of the second transistor.

In a second aspect, the present disclosure provides the radio frequency chip including the radio frequency low-noise amplifier circuit mentioned above.

Compared with the prior art, in embodiments of the present disclosure, an input signal input from the signal input end is inputted into the amplification circuit through the input matching circuit, the input signal is amplified by the amplification circuit and is output to the output matching circuit, and an amplified signal output from the amplification circuit is output through the output matching circuit. The input end of the gain adjustment circuit is connected to another end of the amplification circuit to adjust a gain of the amplified signal. The output end of the gain adjustment circuit is grounded. The source of the tenth transistor, the source of the eleventh transistor, and the source of the twelfth transistor of the gain adjustment circuit are connected to each other and are grounded; the drain of the tenth transistor is connected to the first end of the first resistor, the drain of the eleventh transistor is connected to the first end of the second resistor, and the drain of the twelfth transistor is connected to the first end of the third resistor. The second end of the first resistor, the second end of the second resistor, and the second end of the third resistor are connected to the first end of the fourth capacitor. The second end of the fourth capacitor is configured as the input end of the gain adjustment circuit and is connected to the amplification circuit. The input signal is amplified by the amplification circuit, so that the greater a total current, the higher the gain. The tenth transistor, the eleventh transistor, and the twelfth transistor of the gain adjustment circuit respectively form attenuation branches with the first resistor, the second resistor, and the third resistor, so that the more conductive branches there are, the lower the gain.

In this way, the gain of the radio frequency low-noise amplifier circuit is adjustable, and configuration adjustment of the gain is realized to adapt to radio frequency input signals of different power sizes.

BRIEF DESCRIPTION OF DRAWINGS

The present disclosure is described in detail below in conjunction with the accompanying drawings. The above or other aspects of the present disclosure will become clearer and easier to understand through the detailed description made in conjunction with the following drawings.

Figure 1:
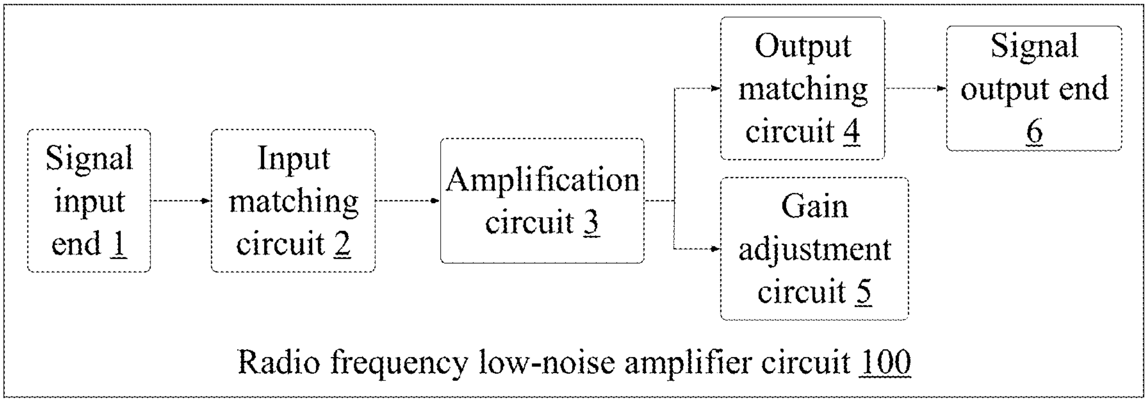
FIG. 1 is a schematic diagram of modules of a radio frequency low-noise amplifier circuit according to one embodiment of the present disclosure.

Reference numbers in the drawings: 100—radio-frequency low-noise amplifier circuit, 1—signal input end, 2—input matching circuit, 21—first input matching network, 22—second input matching network, 3—amplification circuit, 4—output matching circuit, 5—gain adjustment circuit, 6—signal output end.

DETAILED DESCRIPTION

Unless otherwise defined, all technical and scientific terms used herein have the same meaning as commonly understood by those skilled in the art of the present disclosure. The terms used in the description of the present disclosure herein are only for the purpose of describing specific embodiments, and are not intended to limit the present disclosure. In the specification and claims of the present disclosure, terms "have", "include", and any variations thereof are intended to cover non-exclusive inclusion. Terms "first", "second", and the like in the specification and claims of the present disclosure and the accompanying drawings are used to distinguish different objects, and are not used to describe a specific order. Reference herein to "embodiment" means that a particular feature, structure, or characteristic described in connection with one embodiment may be included in at least one embodiment of the present disclosure. The appearances of the "embodiment" in various positions in the specification are not necessarily referring to the same embodiment, and are not independent or alternative embodiments mutually exclusive of other embodiments. Those skilled in the art explicitly and implicitly understand that the embodiments described herein may be combined with other embodiments.

Technical solutions in the embodiments of the present disclosure will be clearly and completely described below in conjunction with the accompanying drawings in the embodiments of the present disclosure. Obviously, the described embodiments are only a part of the embodiments of the present disclosure, rather than all of the embodiments. The following description of at least one exemplary embodiment is merely illustrative and is in no way intended as any limitation on the present disclosure, applications thereof, and use thereof. Based on the embodiments of the present disclosure, all other embodiments obtained by those of ordinary skill in the art without creative work shall fall within the protection scope of the present disclosure.

Embodiment 1

Figure 2:
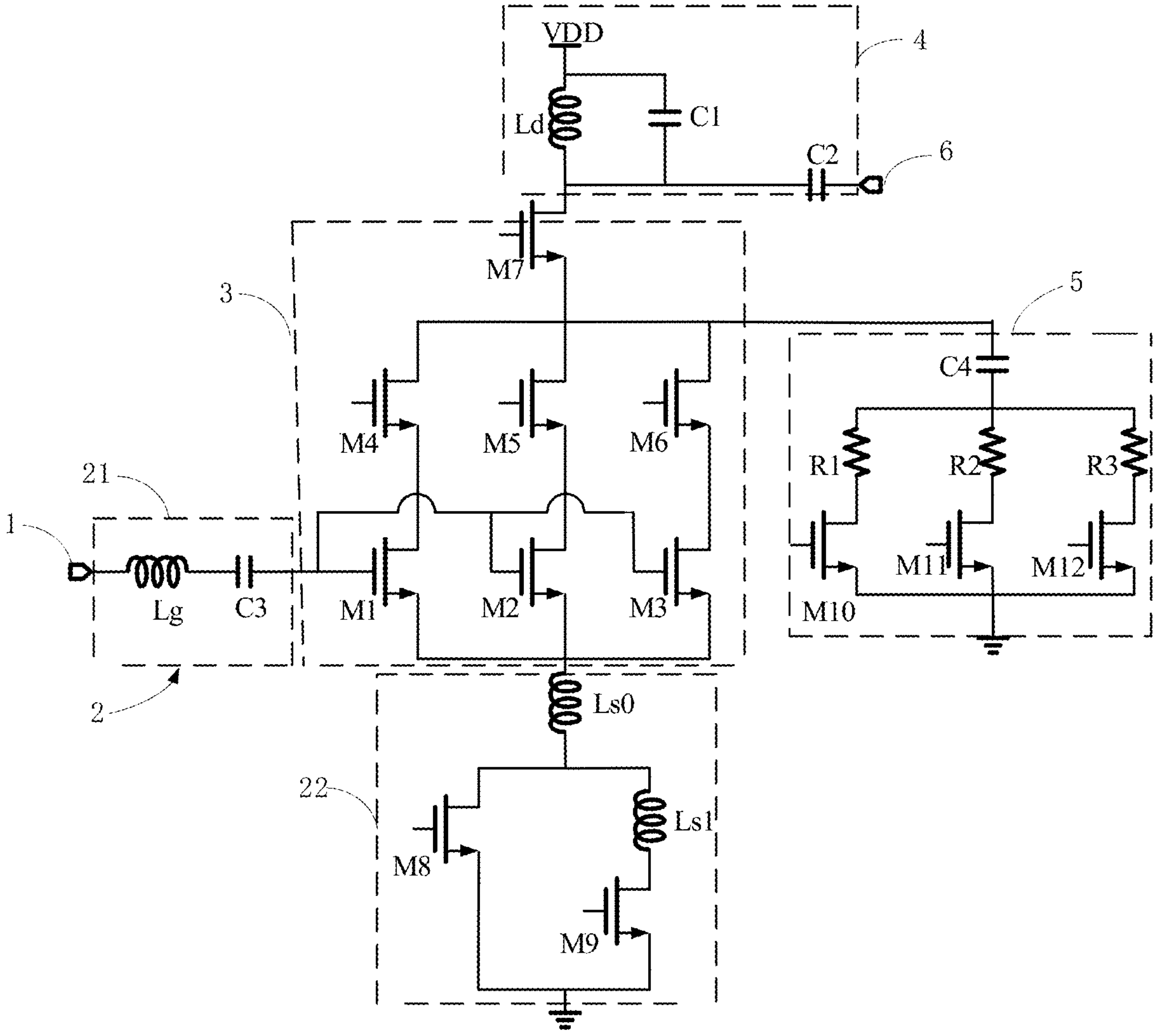
FIG. 2 is a circuit schematic diagram of the radio frequency low-noise amplifier circuit according to one embodiment of the present disclosure.

As shown in FIGS. 1 and 2, the present disclosure provides a radio frequency low-noise amplifier circuit 100. The radio frequency low-noise amplifier circuit 100 comprises a signal input end 1, an input matching circuit 2, an amplification circuit 3, an output matching circuit 4, a signal output end 6, and a gain adjustment circuit 5.

The signal input end 1 is configured to connect an input signal. The input signal is single-ended input signal.

A first end of the input matching circuit 2 is connected to the signal input end 1, and is configured to match and output the input signal. The input matching circuit 2 performs matching processing on the input signal to obtain a matching signal, and transmits the matching signal to a first end of the amplification circuit 3.

A first end of the amplification circuit 3 is connected in series with a second end of the input matching circuit 2 to amplify the matching signal to obtain an amplified signal. The matching signal output by the input matching circuit 2 is amplified, thereby increasing a gain of a radio frequency chip.

A first end of the output matching circuit 4 is connected to a second end of the amplification circuit 3 to output the amplified signal output by the amplifier circuit 3.

A first end of the gain adjustment circuit 5 is connected to the second end of the amplification circuit 3, and is configured to adjust a gain attenuation of the amplified signal. A second end of the gain adjustment circuit 5 is grounded. By connecting to the second end of the amplification circuit 3, the amplified signal is attenuated by the gain adjustment circuit 5 to reduce the gain, so that it is convenient to adjust the gain of the radio frequency chip.

The signal output end 6 is connected to the second end of the output matching circuit 4 for outputting the amplified signal.

Specifically, the input signal input from the signal input end 1 is inputted into the amplification circuit 3 through the input matching circuit 2, the input signal is amplified by the amplification circuit 3 and is output to the output matching circuit 4, and the amplified signal output from the amplification circuit 3 is output through the output matching circuit 4. The first end of the gain adjustment circuit is connected to the second end of the amplification circuit to adjust the gain of the amplified signal. The second end of the gain adjustment circuit 5 is grounded. The signal output end 6 is connected to the second end of the output matching circuit 4 for outputting the amplified signal. The input signal is amplified by the amplification circuit 3, so that the greater a total current, the higher the gain. The gain adjustment circuit 5 forms an attenuation branch for the amplification circuit 3, so that the gain is lower. In this way, the gain of the radio frequency low-noise amplifier circuit 100 is adjustable, and the configuration adjustment of the gain is realized to adapt to radio frequency input signals of different power sizes.

In the embodiment, the gain adjustment circuit 5 comprises a tenth transistor M10, an eleventh transistor M11, a twelfth transistor M12, a first resistor R1, a second resistor R2, a third resistor R3, and a fourth capacitor C4.

A drain of the tenth transistor M10 is connected to a first end of the first resistor R1, a drain of the eleventh transistor M11 is connected to a first end of the second resistor R2, and a drain of the twelfth transistor M12 is connected to a first end of the third resistor R3. A source of the tenth transistor M10, a source of the eleventh transistor M11, and a source of the twelfth transistor M12 are connected to each other and are grounded. A second end of the first resistor R1, a second end of the second resistor R2, and a second end of the third resistor R3 are connected to a first end of the fourth capacitor C4. A second end of the fourth capacitor C4 is configured as an input end of the gain adjustment circuit 5 and is connected to the amplification circuit 3. By connecting a gate of the tenth transistor M10, a gate of the eleventh transistor M11 and a gate of the twelfth transistor M12 to a digital control logic circuit, on or off of the tenth transistor M10, the eleventh transistor M11 and the twelfth transistor M12 is effectively controlled, thereby controlling the gain, and a control effect is good.

Specifically, the second end of the fourth capacitor C4 is connected to the source of the seventh transistor M7, the second end of the fourth capacitor C4 is connected in series with the tenth transistor M10, the eleventh transistor M11, and the twelfth transistor M12 through the first resistor R1, the second resistor R2, and the third resistor R3, respectively, and grounded. When the tenth transistor M10, the eleventh transistor M11, and the twelfth transistor M12 are turned on, a part of a small signal current is bypassed to the ground, so as to realize the adjustment of the gain attenuation. In this way, the adjustment of the gain is realized by changing the number of transistor tubes, an inductance value, and a resistance value.

In the embodiment, the amplification circuit 3 comprises a first transistor M1, a second transistor M2, a third transistor M3, a fourth transistor M4, a fifth transistor M5, and a sixth transistor M6.

A source of the first transistor M1, a source of the second transistor M2 and a source of the third transistor M3 are connected to each other to form a common input structure. The common input structure is connected to the input matching circuit 2. A drain of the first transistor M1 is connected to a source of the fourth transistor M4, a drain of the second transistor M2 is connected to a source of the fifth transistor M5, and a drain of the third transistor M3 is connected to a source of the sixth transistor M6. A gate of the first transistor, a gate of the second transistor, and a gate of the third transistor are connected to each other and are connected to the input matching circuit. A gate of the first transistor M1, a gate of the second transistor M2, and a gate of the third transistor M3 are connected to each other and are connected to the input matching circuit 2. A drain of the fourth transistor M4, a drain of the fifth transistor M5, and a drain of the sixth transistor M6 are connected to each other and are connected to an input end of the output matching circuit 4 and an input end of the gain adjustment circuit 5.

The first transistor M1, the second transistor M2, and the third transistor M3 are input common source amplifier transistors. The first transistor M1, the second transistor M2, and the third transistor M3 are respectively controlled by the fourth transistor M4, the fifth transistor M5 and the sixth transistor M6, so as to adjust three amplification branches.

Specifically, the input signal output by the input matching circuit 2 is output to the gate of the first transistor M1, the gate of the second transistor M2, and the gate of the third transistor M3. The first transistor M1, the second transistor M2, and the third transistor M3 amplify the input signal of the three conducting branches (i.e., the amplification branches). The fourth transistor M4 connected to the first transistor M1, the fifth transistor M5 connected to the second transistor M2, and the sixth transistor M6 connected to the third transistor M3 are respectively configured to control an amplification of the input signal, so that the more conducting branches there are, the larger the total current of a radio frequency low-nose amplifier is, and the higher the gain is.

Optionally, the number of the conducting branches are not limited to three, but may be but one, two, four, etc. The more the conducting branches, the greater the total current of the radio frequency low-nose amplifier and the higher the gain. The specific option may be made according to actual situations, which are not described herein.

In the embodiment, the amplification circuit 3 further comprises a seventh transistor M7. A source of the seventh transistor M7 is connected to the drain of the fourth transistor M4, the drain of the fifth transistor M5 and the drain of the sixth transistor M6 respectively. A drain of the seventh transistor M7 is connected to the input end of the output matching circuit 4.

The seventh transistor M7 is a common-gate configuration amplifier. The source of the seventh transistor M7 is respectively connected to the drain of the fourth transistor M4, the drain of the fifth transistor M5 and the drain of the sixth transistor M6, and the drain of the seventh transistor M7 is connected to the input end of the output matching circuit 4, thereby playing a role of voltage division and input-output isolation and having high safety.

In the embodiment, the output matching circuit 4 comprises a first inductor Ld, a first capacitor C1, and a second capacitor C2. The first capacitor C1 is connected in parallel with the first inductor Ld. A first-second end of the first inductor Ld and one end of the first capacitor C1 is connected to the drain of the seventh transistor M7, and a first end of the first inductor Ld connected in parallel with the first capacitor C1 is connected to a power supply voltage VDD. A first end of the second capacitor C2 is connected to the second end of the first inductor Ld, and a second end of the second capacitor C2 is connected to the signal output end 6.

The first inductor Ld is a choke inductor and is configured to filter, oscillate, stabilize the current and suppress electromagnetic interference. The first inductor Ld and the first capacitor C1 forming an LC filter circuit, so that filtering and anti-interference effects are realized.

Optionally, the output matching circuit 4 is configured to match an output impedance of the radio frequency low-noise amplifier to 50 ohms consistent with the load, so that the radio frequency low-noise amplifier has strong anti-interference performance.

Specifically, the seventh transistor M7 transmits the amplified signal to the first end of the first inductor Ld and the first end of the first capacitor C1. By connecting the first inductor Ld and the first capacitor C1 in parallel, a resonance of the first inductor Ld and the first capacitor C1 is in a working frequency band, which plays a role in frequency selection. The second capacitor C2 isolates an output direct current (DC) signal and has a DC isolation effect.

In the embodiment, the input matching circuit 2 comprises a first input matching network 21 and a second input matching network 22. An input end of the first input matching network 21 is connected to the signal input end 1. An output end of the first input matching network 21 is connected to the gate of the first transistor M1, an output end of the second input matching network 22 is grounded, and an input end of the second input matching network 22 is connected to a source of the first transistor M1.

The first input matching network 21 matches the input signal to the amplification circuit 3, and the second input matching network 22 is configured to control a source switching of the first transistor M1, the second transistor M2, and the third transistor M3, so that a gain gear switching is convenient.

In the embodiment, the first input matching network 21 comprises a second inductor Lg and a third capacitor C3. A first end of the second inductor Lg is configured as the input end of the first input matching network 21 and is connected to the signal input end 1. A second end of the second inductor Lg is connected to a first end of the third capacitor C3, and a second end of the third capacitor C3 is connected to the gate of the first transistor M1. The signal input end 1 inputs the input signal to the second inductor Lg. The input signal is output to the third capacitor C3 through the second inductor Lg to isolate the DC signal and output the AC signal to the gate of the first transistor M1, the gate of the second transistor M2, and the gate of the third transistor M3. The first transistor M1, the second transistor M2, and the third transistor M3 amplify the input signal, and output the input signal to the output matching circuit 4 from the fourth transistor M4, the fifth transistor M5, and the sixth transistor M6 respectively. At the same time, the second inductor Lg, the third capacitor, and the gate of the first transistor M1 are connected in series, so that the first input matching network 21 resonates at a wording frequency, realizing low-noise input matching of the radio frequency low-noise amplifier.

In the embodiment, the second input matching network 22 comprises an eighth transistor M8, a ninth transistor M9, a third inductor Ls1, and a fourth inductor Ls0. A source of the eighth transistor M8 and a source of the ninth transistor M9 are connected to each other and are grounded. A drain of the ninth transistor M9 is connected to a first end of the third inductor Ls1, and a drain of the eighth transistor M8 is connected to a second end of the third inductor Ls1. A first end of the fourth inductor Ls0 is connected to the second end of the third inductor Ls1, and a second end of the fourth inductor Ls0 is connected to the source of the second transistor M2. In the embodiment, the fourth inductor Ls0 and the third inductor Ls1 are source inductors.

Specifically, the fourth inductor Ls0 and the third inductor Ls1 are source inductors and are configured to provide a real impedance for input matching. When in high gain gear, the eighth transistor M8 is turned on, the ninth transistor M9 is turned off, and only the fourth inductor Ls0 works. In low gain gear, the eighth transistor M8 is turned off, the ninth transistor M9 is turned on, and a total source inductance is a total inductance value of the fourth inductor Ls0 and the third inductor Ls1 that are connected in series, which not only realize an effect of reducing gain, but also compensates for reduction in a real part of input impedance caused by the reduction in transistor transconductance in a low gain gear state. Therefore, the low gain gear has a relatively good input return loss performance, and gain gear is flexible and adjustable. Moreover, under each gain gear, the input and output return losses do not deteriorate, and the safety is high.

Embodiment 2

The present disclosure provides a radio frequency chip including the radio frequency low-noise amplifier circuit 100 mentioned above. Through the radio frequency low-noise amplifier circuit 100, the radio frequency chip realizes the configuration adjustment of the gain to adapt to the radio frequency input signals of different power sizes.

It should be noted that the embodiments described above with reference to the accompanying drawings are only used to illustrate the scope of the present disclosure, and those skilled in the art should understand that modifications or equivalent replacements made to the present disclosure without departing from the spirit and scope of the present disclosure shall fall within the scope of the present disclosure. Furthermore, unless otherwise noted in the context, words appearing in the singular include plural forms and vice versa. Additionally, all or a portion of any embodiment may be used in connection with all or a portion of any other embodiment unless specifically stated.

What is claimed is:

1. A radio frequency low-noise amplifier circuit, comprising:

a signal input end, an input matching circuit, an amplification circuit, an output matching circuit, a signal output end, and a gain adjustment circuit connected in parallel with the amplification circuit;

wherein the signal input end, the input matching circuit, the amplification circuit, the output matching circuit, and the signal output end are connected in sequence; the gain adjustment circuit comprises a tenth transistor, an eleventh transistor, a twelfth transistor, a first resistor, a second resistor, a third resistor, and a fourth capacitor;

wherein a source of the tenth transistor, a source of the eleventh transistor, and a source of the twelfth transistor are connected to each other and are grounded; a drain of the tenth transistor is connected to a first end of the first resistor, a drain of the eleventh transistor is connected to a first end of the second resistor, and a drain of the twelfth transistor is connected to a first end of the third resistor;

wherein a gate of the tenth transistor, a gate of the eleventh transistor, and a gate of the twelfth transistor are connected to a digital control logic circuit;

wherein a second end of the first resistor, a second end of the second resistor, and a second end of the third resistor are connected to a first end of the fourth capacitor; a second end of the fourth capacitor is configured as an input end of the gain adjustment circuit and is connected to the amplification circuit;

wherein the input matching circuit comprises a first input matching network and a second input matching network; an input end of the first input matching network is connected to the signal input end; an output end of the second input matching network is grounded;

wherein the amplification circuit comprises a first transistor, a second transistor, a third transistor, a fourth transistor, a fifth transistor, and a sixth transistor;

wherein a source of the first transistor, a source of the second transistor and a source of the third transistor are connected to each other to form a common input structure; the common input structure is connected to an input end of the second input matching network, a drain of the first transistor is connected to a source of the fourth transistor, a drain of the second transistor is connected to a source of the fifth transistor, and a drain of the third transistor is connected to a source of the sixth transistor; a gate of the first transistor, a gate of the second transistor, and a gate of the third transistor are connected to each other and are connected to an output end of the first input matching network;

wherein a drain of the fourth transistor, a drain of the fifth transistor, and a drain of the sixth transistor are connected to each other and are connected to an input end of the output matching circuit and an input end of the gain adjustment circuit.

2. The radio frequency low-noise amplifier circuit according to claim 1, wherein the amplification circuit further comprises a seventh transistor; a source of the seventh transistor is connected to the drain of the fourth transistor, and a drain of the seventh transistor is connected to the input end of the output matching circuit.

3. The radio frequency low-noise amplifier circuit according to claim 2, wherein the output matching circuit comprises a first inductor, a first capacitor, and a second capacitor; a first end of the first inductor is connected to a power supply voltage; and a second end of the first inductor is configured as the input end of the output matching circuit and is connected to the drain of the seventh transistor, the first capacitor is connected in parallel with the first inductor; a first end of the second capacitor is connected to the second end of the first inductor, and a second end of the second capacitor is connected to the signal output end.

4. The radio frequency low-noise amplifier circuit according to claim 1, wherein the first input matching network comprises a second inductor and a third capacitor; a first end of the second inductor is configured as the input end of the first input matching network and is connected to the signal input end; a second end of the second inductor is connected to a first end of the third capacitor, and a second end of the third capacitor is connected to the gate of the first transistor.

5. The radio frequency low-noise amplifier circuit according to claim 1, wherein the second input matching network comprises an eighth transistor, a ninth transistor, a third inductor, and a fourth inductor; a source of the eighth transistor and a source of the ninth transistor are connected to each other and are grounded; a drain of the ninth transistor is connected to a first end of the third inductor; a drain of the eighth transistor is connected to a second end of the third inductor; a first end of the fourth inductor is connected to the second end of the third inductor; a second end of the fourth inductor is connected to the source of the second transistor.

6. The radio frequency low-noise amplifier circuit according to claim 5, wherein the third inductor and the fourth inductor are connected in series to form a source inductor of the second transistor.

7. A radio frequency chip, comprising the radio frequency low-noise amplifier circuit according to claim 1.

* * * * *